(12) United States Patent
Xiao

(10) Patent No.: US 9,905,677 B2
(45) Date of Patent: Feb. 27, 2018

(54) METHOD TO FORM A CYLINDRICAL GERMANIUM NANOWIRE DEVICE ON BULK SILICON SUBSTRATE

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/571,287

(22) Filed: Dec. 16, 2014

(65) Prior Publication Data

US 2016/0064531 A1 Mar. 3, 2016

(30) Foreign Application Priority Data

Aug. 26, 2014 (CN) .......................... 2014 1 0421826

(51) Int. Cl.
*H01L 29/06* (2006.01)
*H01L 29/66* (2006.01)
(Continued)

(52) U.S. Cl.
CPC .. *H01L 29/66818* (2013.01); *H01L 21/02381* (2013.01); *H01L 21/02532* (2013.01);
(Continued)

(58) Field of Classification Search
CPC ......... H01L 21/02381; H01L 21/02532; H01L 21/02603; H01L 21/31658; H01L 29/0669;
(Continued)

(56) References Cited

U.S. PATENT DOCUMENTS 8,872,161 B1 * 10/2014 Ching ................. H01L 29/0673
257/24
2006/0216897 A1 9/2006 Lee et al.
(Continued)

FOREIGN PATENT DOCUMENTS

CN 102082096 6/2011
CN 102496563 6/2012
(Continued)

OTHER PUBLICATIONS

Han et al., "Characteristic of p-Type Junctionless Gate-All-Around Nanowire Transistor and Sensitivity Analysis", IEEE Electron Device Letters, vol. 34, No. 2, Feb. 2013, pp. 157-159.*
(Continued)

*Primary Examiner* — Matthew E Warren
(74) *Attorney, Agent, or Firm* — Kilpatrick Townsend & Stockton LLP

(57) ABSTRACT

A method for manufacturing a semiconductor device includes providing a substrate structure having a substrate and a cavity in the substrate, epitaxially growing a SiGe nanowire in the cavity, and removing a portion of the substrate surrounding the SiGe nanowire to substantially expose a surface of the SiGe nanowire. The method further includes oxidizing the exposed surface of the SiGe nanowire to form an oxide layer, removing the oxide layer by etching, and repeating the oxidizing and removing steps to form a suspended germanium nanowire in the cavity.

17 Claims, 12 Drawing Sheets

(51) Int. Cl.
  *H01L 29/78* (2006.01)
  *H01L 21/02* (2006.01)
  *H01L 29/775* (2006.01)
  *H01L 29/423* (2006.01)
  *H01L 29/786* (2006.01)

(52) U.S. Cl.
  CPC .... *H01L 21/02603* (2013.01); *H01L 29/0673* (2013.01); *H01L 29/42392* (2013.01); *H01L 29/66439* (2013.01); *H01L 29/66742* (2013.01); *H01L 29/775* (2013.01); *H01L 29/785* (2013.01); *H01L 29/78603* (2013.01); *H01L 29/78684* (2013.01); *H01L 29/78696* (2013.01)

(58) Field of Classification Search
  CPC ........... H01L 29/0673; H01L 29/66818; H01L 29/78684; H01L 29/78696
  See application file for complete search history.

(56) References Cited

U.S. PATENT DOCUMENTS

| | | | | |
|---|---|---|---|---|
| 2011/0070734 A1* | 3/2011 | Saracco | ................. | B82Y 10/00 438/689 |
| 2013/0105897 A1* | 5/2013 | Bangsaruntip | ......... | B82Y 10/00 257/351 |
| 2013/0228833 A1* | 9/2013 | Xiao | ...................... | B82Y 10/00 257/288 |
| 2015/0249139 A1* | 9/2015 | Cheng | ............... | H01L 29/42392 438/504 |
| 2015/0263094 A1* | 9/2015 | Diaz | ................... | H01L 29/7842 257/24 |
| 2015/0287782 A1* | 10/2015 | Sassiat | ............... | H01L 29/0673 257/327 |
| 2016/0049516 A1* | 2/2016 | Huang | ............... | H01L 29/7853 257/401 |

FOREIGN PATENT DOCUMENTS

| | | |
|---|---|---|
| CN | 103632923 | 3/2014 |
| CN | 103854971 | 6/2014 |

OTHER PUBLICATIONS

Definition of "cavity", Merriam-Webster online dictionary, http://www.merriam-webster.com/dictionary/cavity, downloaded Sep. 16, 2016.*

Chinese Application No. 201410421826.5, Office Action dated on Dec. 11, 2017, 6 pages.

* cited by examiner

METHOD TO FORM A CYLINDRICAL GERMANIUM NANOWIRE DEVICE ON BULK SILICON SUBSTRATE

CROSS-REFERENCES TO RELATED APPLICATIONS

This application claims priority to Chinese patent application No. 201410421826.5, filed on Aug. 26, 2014, the content of which is incorporated herein by reference in its entirety.

BACKGROUND OF THE INVENTION

The present invention relates to semiconductor devices, and more particularly to semiconductor devices having a cylindrical germanium nanowire structure and methods for manufacturing the same.

As the feature size of CMOS semiconductor devices is continuingly scaled down, the short channel effect causes a decrease in the threshold voltage. A decrease in the threshold voltage, however, leads to an increase in the off-state leakage current. In general, the short channel effect can be eliminated or reduced by reducing the thickness of the gate dielectric layer and increasing the doping concentration of the substrate or using source/drain halo structures. However, this may result in an increase in the gate dielectric tunneling current and degradation in the mobility of the channel carriers, leading to an increase in the static power consumption and a decrease in device performance. Furthermore, thinning the gate dielectric layer will have a significant polysilicon depletion effect, resulting in a drop in the inversion charge and a decrease in the drive current.

Therefore, conventional techniques of CMOS downscaling cannot overcome the conflicting requirements of short channel effect and power and performance, and have been replaced with the so-called "extended CMOS technology" that includes stress enhancement technology, high-k gate dielectric and metal gate technology. These technologies can temporarily alleviate issues related to short-channel effects including carrier mobility degradation and tunneling current increase. At present, the stress-strain technology applied to the mass production mainly refers to uniaxial tensile stress. For NMOS devices, the technologies are the contact etch stop layer (CESL), stress memorization technique (SMT), and recessed regions filled with silicon carbide (SiC). For PMOS devices, the recessed source and drain regions are filled with SiGe. However, these technologies are also subjected to "size-scaling" constraints. For example, the tensile stress strongly depends on the device feature size (channel length). As the channel length is getting smaller, there is a limit imposed on the carrier mobility.

BRIEF SUMMARY OF THE INVENTION

Embodiments of the present invention relate to a method of manufacturing semiconductor devices, and more particularly to a method of manufacturing a semiconductor device having a germanium wire floating in a substrate. Embodiments of the present invention also provide a semiconductor device having a germanium nanowire in the substrate manufactured according to the inventive method.

In one embodiment, a method for manufacturing a semiconductor device includes providing a substrate structure having a substrate and a cavity in the substrate, epitaxially growing a SiGe nanowire in the cavity, and removing a portion of the substrate surrounding the SiGe nanowire to substantially expose a surface of the SiGe nanowire. The method further includes oxidizing the exposed surface of the SiGe nanowire to form an oxide layer, removing the oxide layer by etching, and repeating the steps of oxidizing and removing to form a suspended germanium nanowire in the cavity.

In an embodiment, the method also includes annealing the Ge nanowire at a temperature in the range between 800° C. and 1000° C. In an embodiment, the annealing is carried out in an inert gas atmosphere or in a reducing gas atmosphere.

In an embodiment, the method further includes forming a gate structure having a gate dielectric layer disposed on the bottom surface and the sidewall surfaces of the cavity and surrounding the Ge nanowire and a gate electrode on the gate dielectric layer and wrapping around the Ge nanowire.

In an embodiment, the method further includes forming source and drain regions on opposite sides of the gate structure.

In an embodiment, the substrate structure may be provided by forming a patterned hard mask on a substrate and etching the substrate through openings in the patterned hard mask to form one or more cavities.

In an embodiment, the SiGe nanowire has a Ge content in a range between 15% and 95% in atomic percent.

In an embodiment, the SiGe nanowire has a thickness in the range between 10 nm and 100 nm.

In an embodiment, the SiGe nanowire includes a substantially circular shape with a diameter in the range between 5 nm and 10 nm.

In an embodiment, the SiGe nanowire has a cylindrical shape with a length in the range between 10 nm and 100 nm.

In an embodiment, the SiGe nanowire is submitted to an oxidation at a temperature in the range between 800° C. and 1000° C. to for an oxide layer.

In an embodiment, the SiGe nanowire may include an n-type dopant or a p-type dopant. In the event that the SiGe nanowire includes an n-type dopant, the semiconductor is an inversion mode device. In the event that the SiGe nanowire comprises a p-type dopant, the semiconductor device is a junction-less device.

Embodiments of the present invention also provide a semiconductor device. The semiconductor device includes a substrate, a cavity in the substrate, and a germanium (Ge) nanowire suspending in the cavity.

In an embodiment, the semiconductor device also includes a gate structure having a gate dielectric layer disposed on a bottom surface and sidewall surfaces of the cavity and surrounding the Ge nanowire.

In an embodiment, the semiconductor device of claim 15 further includes source and drain regions disposed on opposite sides of the gate structure.

In an embodiment, the Ge nanowire has a diameter in a range between 5 nm and 10 nm.

In an embodiment, the Ge nanowire has a length in a range between 10 nm and 100 nm.

Compared with the prior art, the semiconductor device according to the present invention has higher carrier mobility.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

FIGS. 6A and 6B are intermediate stages in the manufacturing of a semiconductor device of FIGS. 2A and 2B;

DETAILED DESCRIPTION OF THE INVENTION

Figure 1:
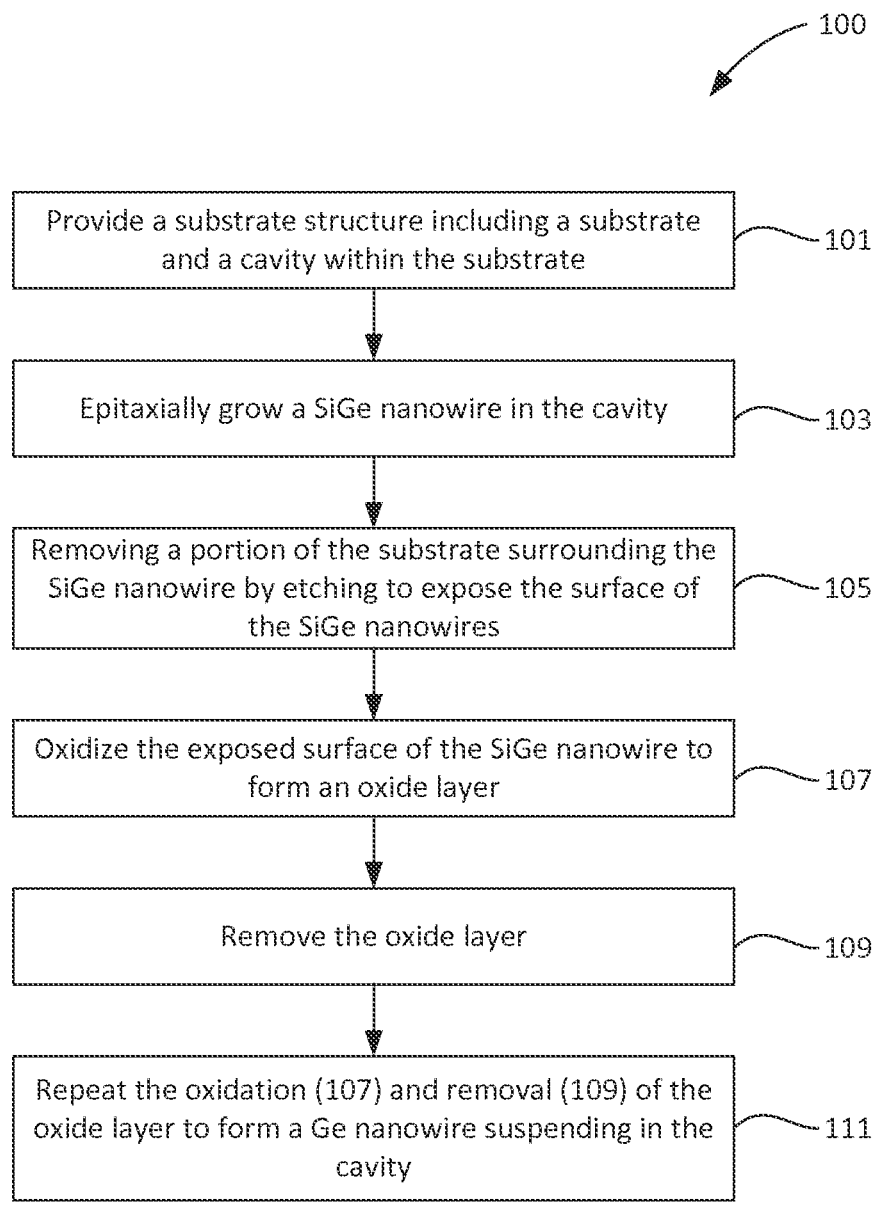
FIG. 1 is a simplified flow chart of a method for manufacturing a semiconductor device according to an embodiment of the present invention.

The present invention will be understood more fully from the detailed description given below and from the accompanying drawings of the preferred embodiments of the invention, which, however, should not be taken to limit the invention to the specific embodiments, but are for explanation and understanding only.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Furthermore, the terminology as used herein is for the purpose of describing example embodiments only and is not intended to be a limitation of the invention. In this respect, as used herein, the term "in" may include "within" and "on", and the terms "a", "an" and "the" may include singular and plural references.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Figure 2A:
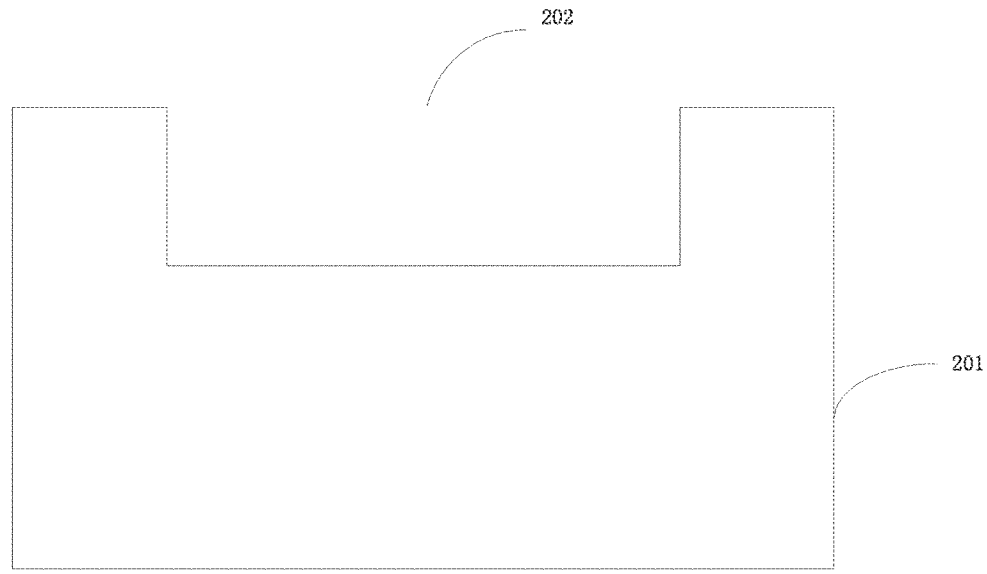
FIG. 2A is a cross-sectional view in the length (longitudinal) direction of a cavity according to an embodiment of the present invention.
Figure 2B:
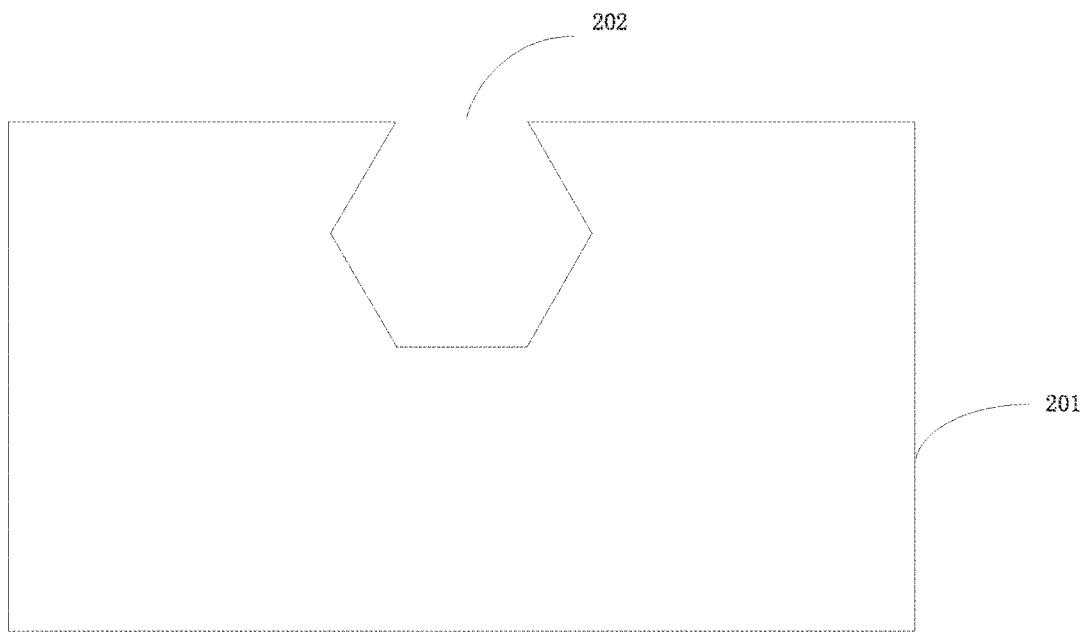
FIG. 2B is a cross-sectional view in the transverse direction that is perpendicular to the length direction of FIG. 2A.

FIG. 1 is a flow chart of a method 100 for manufacturing a semiconductor device according to an embodiment of the present invention. Method 100 begins with providing a substrate structure having a cavity at 101. It should be understood that one cavity is shown for clarity of illustration, the substrate structure may have an array of cavities. The term "cavity" used herein may be understood as "trench", "opening", "groove", "trough", "recess, "recessed region" that can have any shape. For example, FIG. 2A shows a cross-sectional view of a cavity taken along the channel direction of a to-be-fabricated transistor and FIG. 2B is a cross-sectional view taken along the transverse direction of the substrate channel structure according to one embodiment of the present invention. Referring to FIGS. 2A and 2B, the substrate structure includes a substrate 201 and a cavity 202 disposed within substrate 201. FIGS. 2A and 2B show one cavity 202 for the sake clarity, it is understood that the embodiment can have any number of cavities 202 and should not be limiting.

Figure 3:
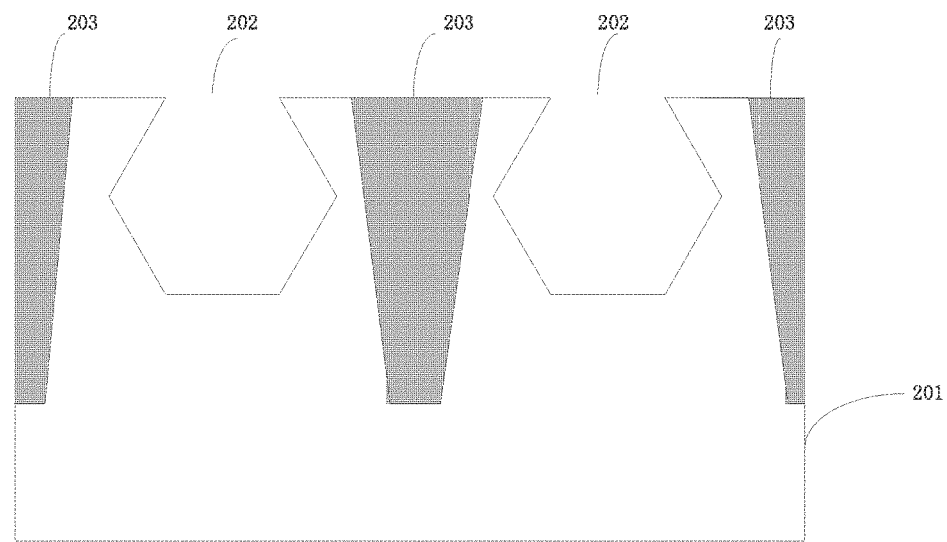
FIG. 3 is a cross-sectional view of an intermediate structure in the manufacturing process of a semiconductor device according to another embodiment of the present invention.

FIG. 3 is a cross-sectional view illustrating a substrate structure having multiple cavities 202 (two cavities are shown). The substrate structure may further include a shallow trench isolation region 203 disposed between two adjacent cavities, as shown in FIG. 3. It should be noted that one cavity will be used in the following description of the manufacturing process, and the shallow trench isolation region is not shown for the clarity of illustration.

Figure 4:
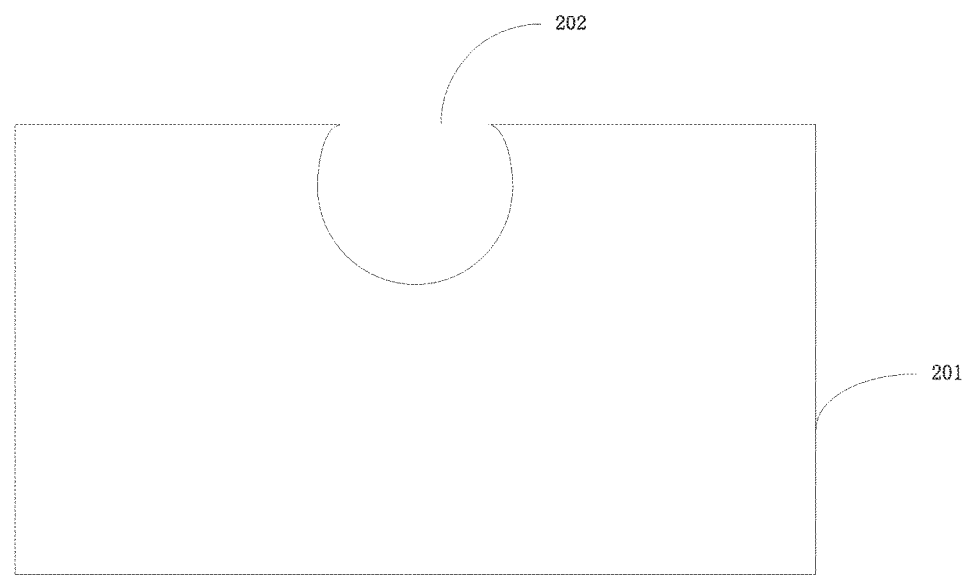
FIG. 4 is a cross-sectional view of an intermediate structure in the manufacturing process of a semiconductor device according to yet another embodiment of the present invention.

Furthermore, in accordance with the present invention, cavity 202 can have different profile or shape based on the design requirements that can be formed using conventional process techniques known to those of skill in the art. In one embodiment, the cross-sectional view of cavity 202 taken along the channel direction (referred to as the shape of the cavity or cavity shape hereinafter) may have a bowl shape (no corners), as shown in FIG. 4. In other embodiments, the shape of the cavity may be rectangular, conical, triangular, polygonal, and so on. It is understood that the present invention is not limited to the above shapes. For example, in some embodiments, the cavity can have many lateral sides (planes) rather than a bottom portion and vertical sidewall portions. For example, the cavity can have a hexagonal shape, an octagonal shape, and the like.

Figure 5:
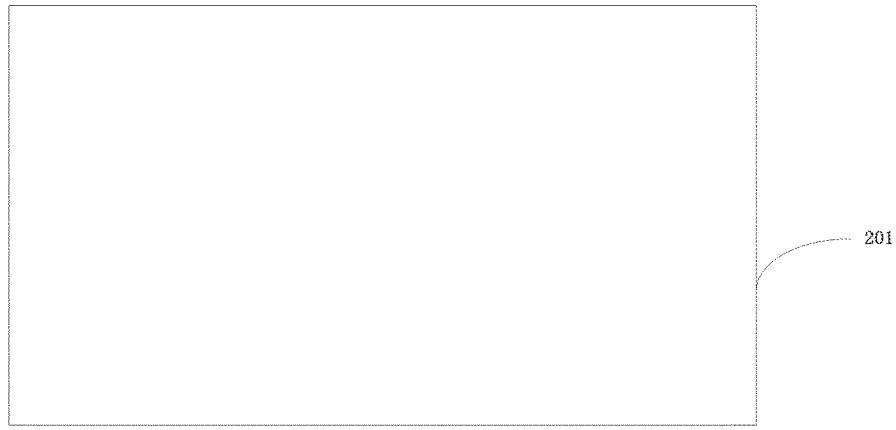
FIG. 5 is a cross-sectional view of a substrate.

FIG. 5 is a cross-sectional view illustrating a process of producing a substrate structure according to an embodiment of the present invention. As shown in FIG. 5, a substrate 201 is provided. In a specific embodiment, substrate 201 can be cleaned by performing a scrubbing process on its surface. Substrate 201 can be a silicon substrate, a silicon-on-insulator (SOI) substrate, and others.

Figure 6A:
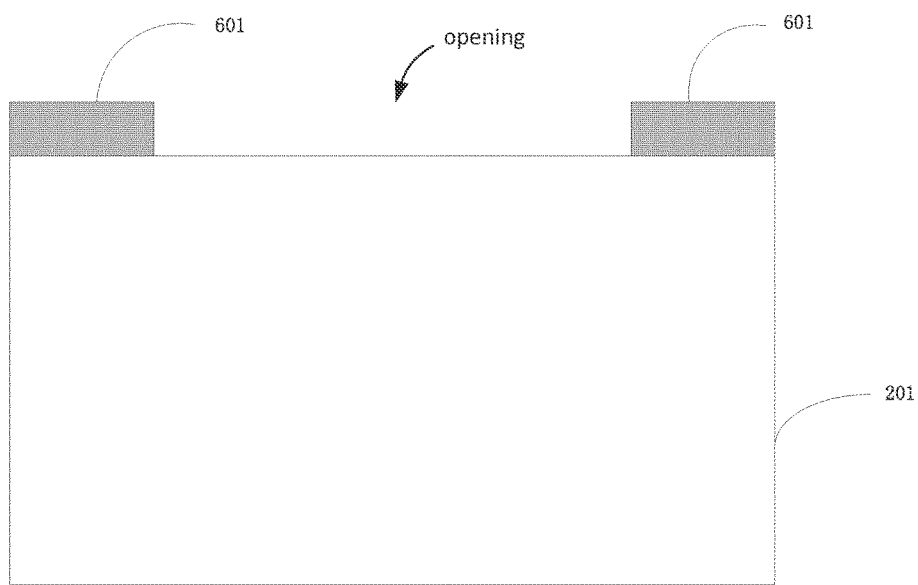
FIG. 6A is a cross-sectional view of FIG. 5 after patterning a hard mask taken along the longitudinal direction.
Figure 6B:
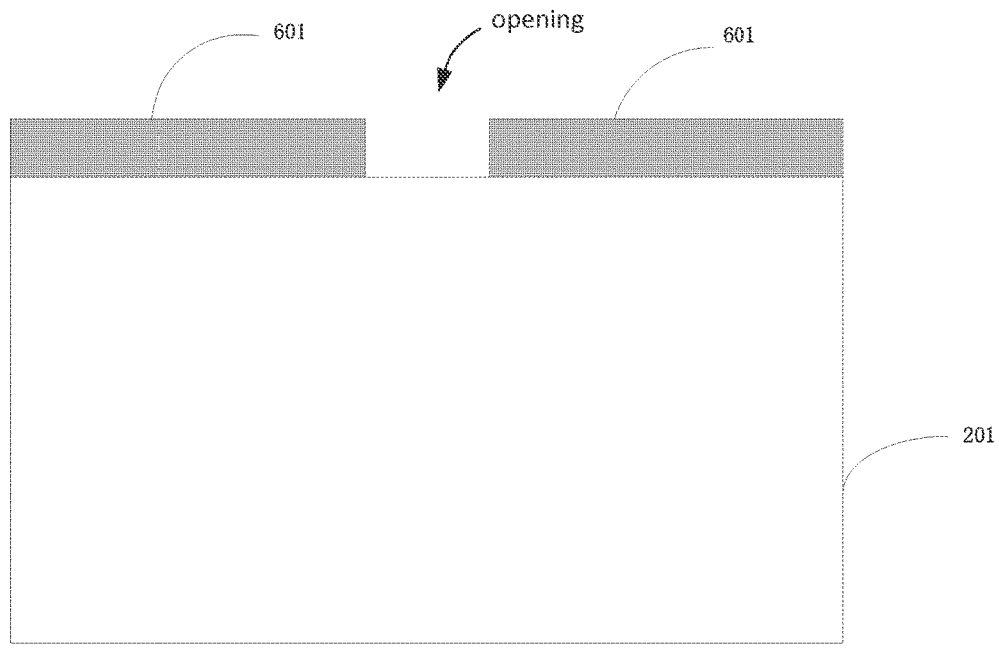
FIG. 6B is a cross-sectional view of FIG. 6A taken along the transverse direction perpendicular to the longitudinal direction of FIG. 6A.

A patterned hard mask 601 is formed on substrate 201 and has an opening for defining a cavity, as shown in FIGS. 6A and 6B. Hard mask 601 may be made of, but not limited to, silicon nitride ($Si_xN_y$), silicon oxide, and the like. For example, the hard mask can be deposited on the substrate and then etched back to form an opening exposing a surface of the substrate.

Thereafter, substrate 201 is etched through the opening of the patterned hard mask to form a cavity. A suitable etchant may be selected based on the surface structure of substrate 201. Depending upon the selected etchant, a cavity having a sigma ($\Sigma$) shape as shown in FIGS. 2A and 2B or a bowl shape as shown in FIG. 4 can be obtained. It should be noted that, in some embodiments, the silicon substrate of FIGS. 2A, 2B and FIG. 4 may include patterned hard mask 601 that is then removed in a subsequent process step.

Figure 7A:
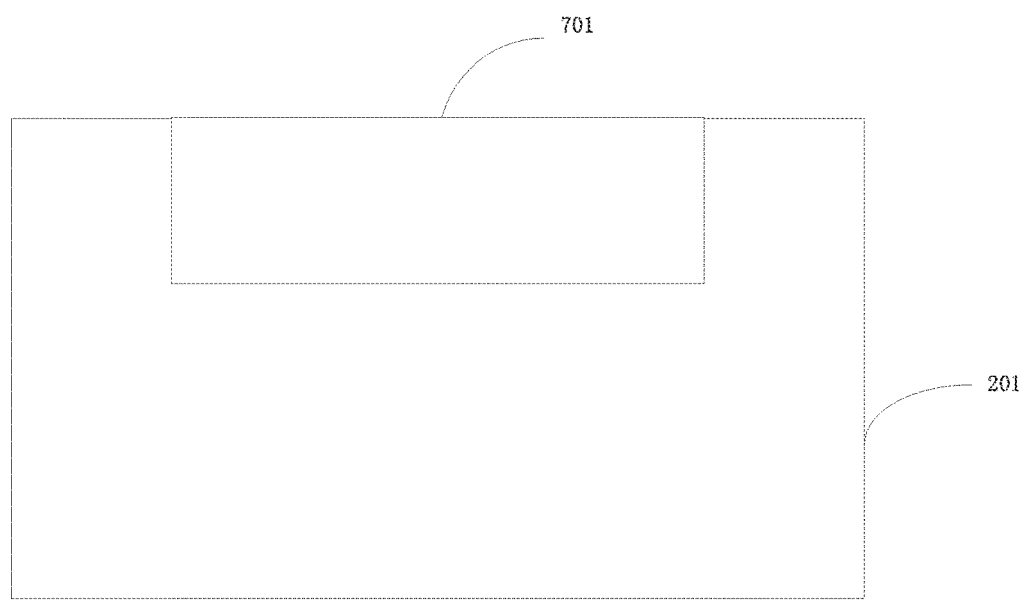
FIGS. 7A and 7B are longitudinal and transverse cross-sectional views of intermediate stages of FIGS. 2A and 2B after an epitaxially growth of a SiGe material.
Figure 7B:
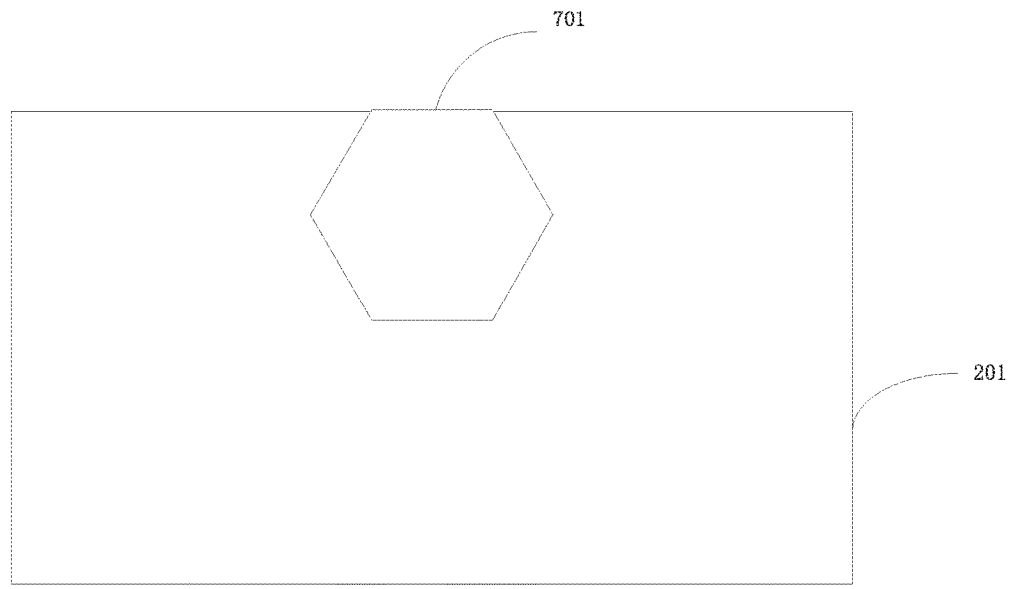

Referring back to FIG. 1, at 103, a SiGe nanowire 701 is epitaxially grown in cavity 202, as shown in FIGS. 7A and 7B. In some embodiments, SiGe nanowire 701 can be epitaxially grown in cavity 202 by chemical vapor deposition (CVD), metal organic chemical vapor deposition (MOCVD), molecular beam epitaxy (MBE), atomic layer deposition (ALD), and the like. In some embodiments, the patterned hard mask (if present) may be removed from the substrate structure. In an exemplary embodiment, the epitaxially grown SiGe nanowire may have a thickness in the range between 10 nm and 100 nm, such as 20 nm, 50 nm, and 80 nm. In one embodiment, the SiGe nanowire has a Ge atomic concentration in the range between 15% and 90% germanium atomic percent, e.g., 40% atomic percent.

In some embodiments, the epitaxially grown SiGe nanowire is an intrinsic layer. In some other embodiments, the epitaxially grown SiGe nanowire can include n-type or p-type dopant, i.e., the epitaxially grown SiGe nanowire can be in situ doped with n-type or p-type dopants.

Figure 8:
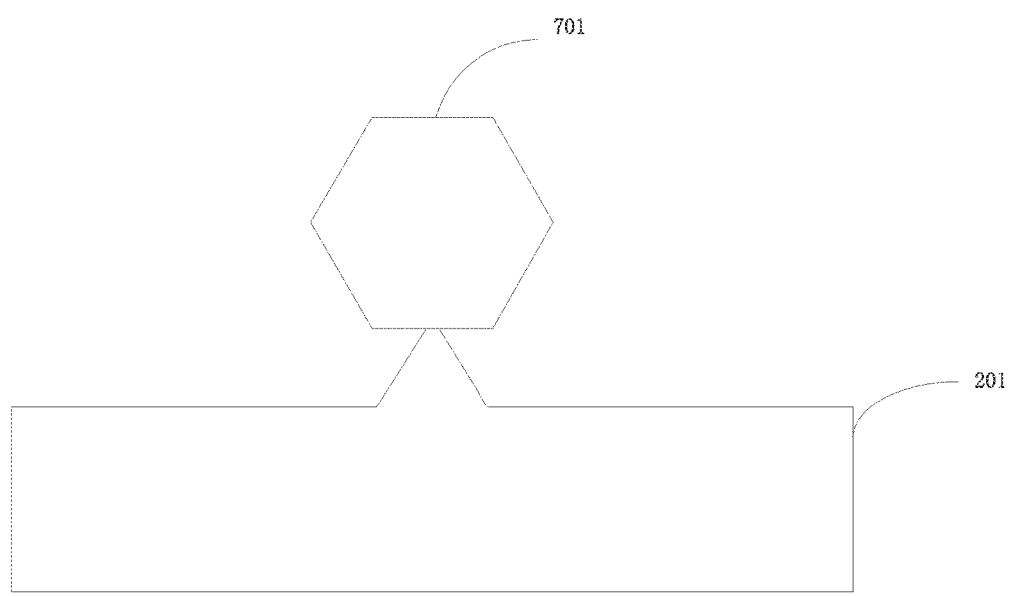
FIG. 8 is a cross-sectional view of an intermediate stage after removing a portion of the substrate surrounding the SiGe material according to an embodiment of the present invention.
Figure 9A:
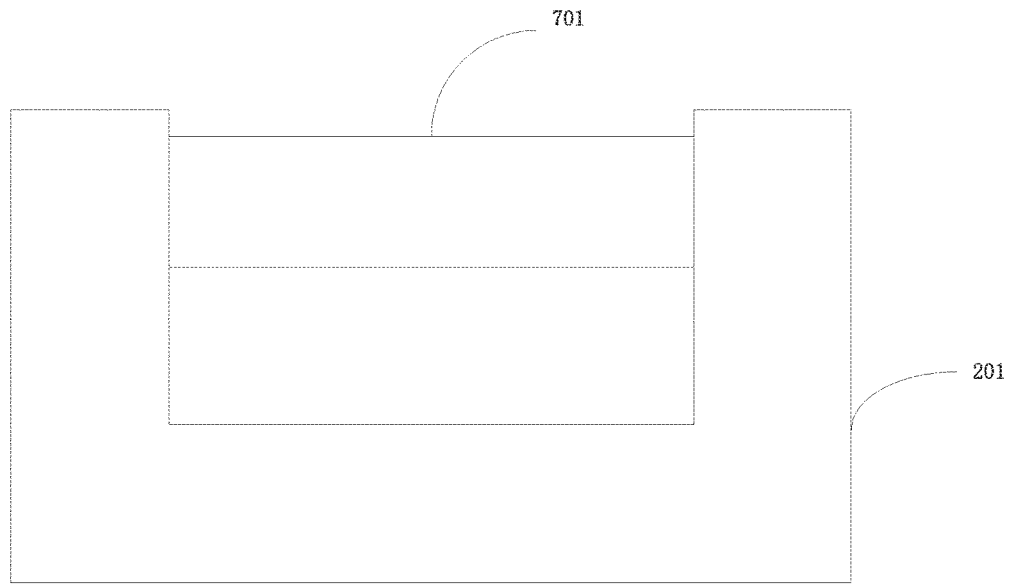
FIGS. 9A and 9B are cross-sectional views of intermediate stages in the manufacturing of a semiconductor device according to an embodiment of the present invention.
Figure 9B:
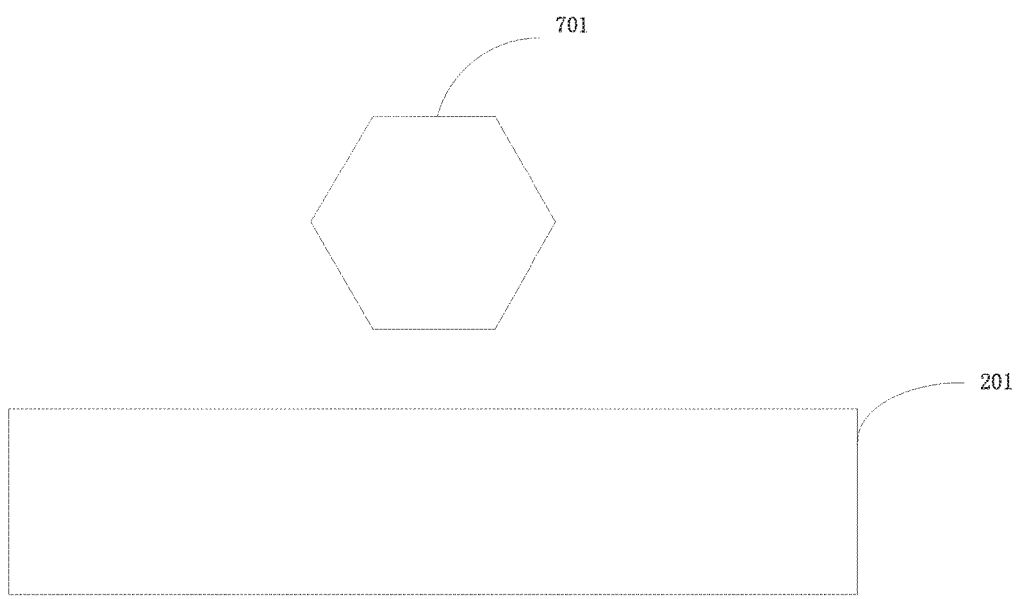

Thereafter, at 105, a portion of the substrate surrounding the SiGe nanowire will be removed by a photolithography and etching process to substantially expose a surface of the SiGe nanowire. It is noted that, as used herein, the term "substantially expose" means a major portion of the substrate is etched away except a small portion located below the bottom surface of the SiGe nanowire, as shown in FIG. 8. In some embodiments, the surface of the SiGe nanowire may be fully exposed so that the SiGe nanowire is suspended (floating) over the substrate, as shown in FIGS. 9A and 9B.

Figure 10:
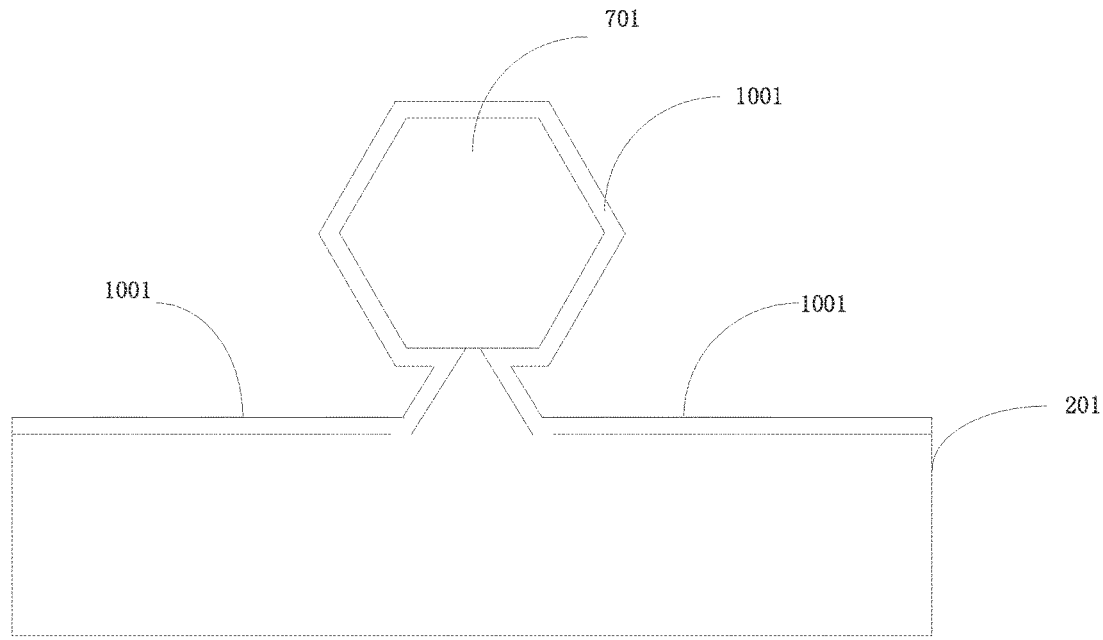
FIG. 10 is a cross-sectional view of an intermediate stage of in the manufacturing of a semiconductor device according to an embodiment of the present invention.

Thereafter, at 107, the exposed surface of the SiGe nanowire is oxidized to form an oxide layer 1001, as shown in FIG. 10. In an embodiment, the oxidation can be carried out at a temperature ranging from 800° C. to 1000° C. It will be appreciated that, when oxidizing the surface of the SiGe nanowire, an oxide layer 1001 is also formed on the surface of substrate 201. The oxidation of the SiGe nanowire will gradually consume (reduce) the silicon in the SiGe nanowire so that the germanium "condenses" in the SiGe nanowire. Furthermore, during the gradual consumption of silicon in the SiGe nanowire, the n-type or p-type dopant (if present) will gradually diffuse into the germanium.

Figure 11:
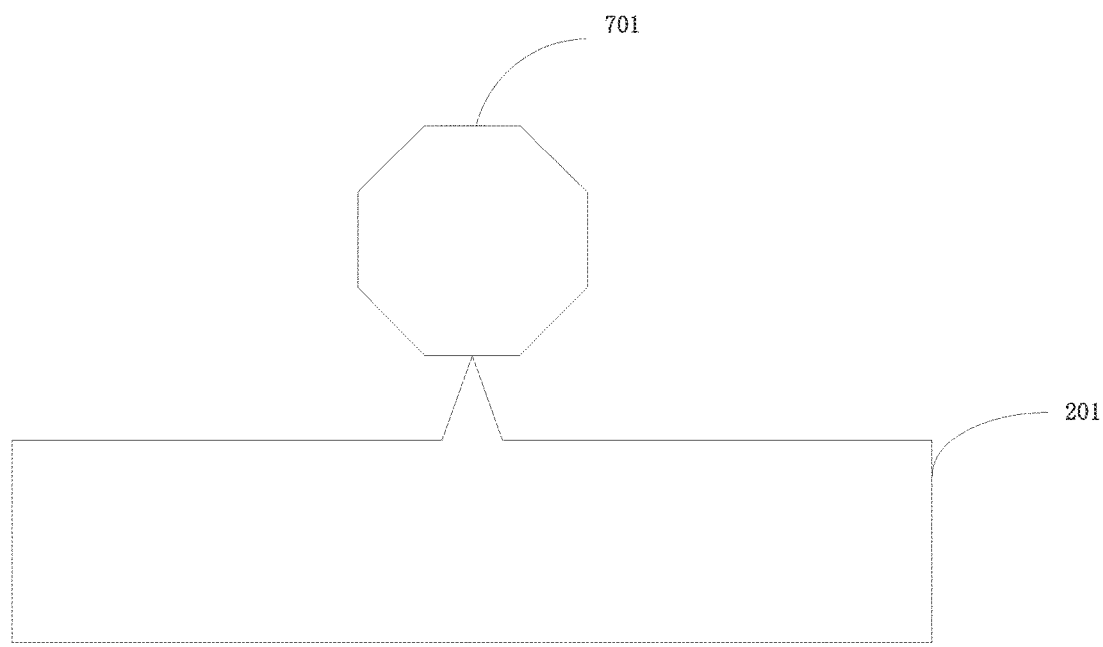
FIG. 11 is a cross-sectional view of an intermediate stage in the manufacturing of a semiconductor device according to an embodiment of the present invention.

Thereafter, at 109, oxide layer 1001 is removed, as shown in FIG. 11. In an embodiment, oxide layer 1001 may be removed by using a buffered oxide etchant (BOE) or a diluted hydrofluoric acid (DHF) as an etchant. At this time, the content of Si in the SiGe nanowire is reduced, the SiGe nanowire takes on a near-circular shape, e.g., the hexagonal shape becomes an octagonal shape.

Figure 12A:
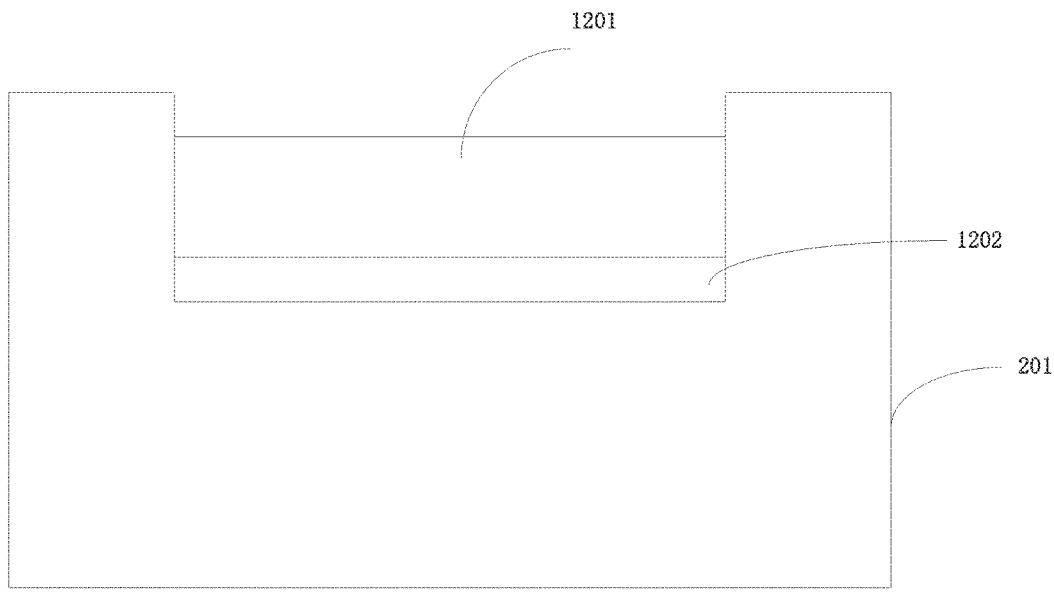
FIGS. 12A and 12B are longitudinal and transverse cross-sectional views illustrating a germanium nanowire according to an embodiment of the present invention.
Figure 12B:
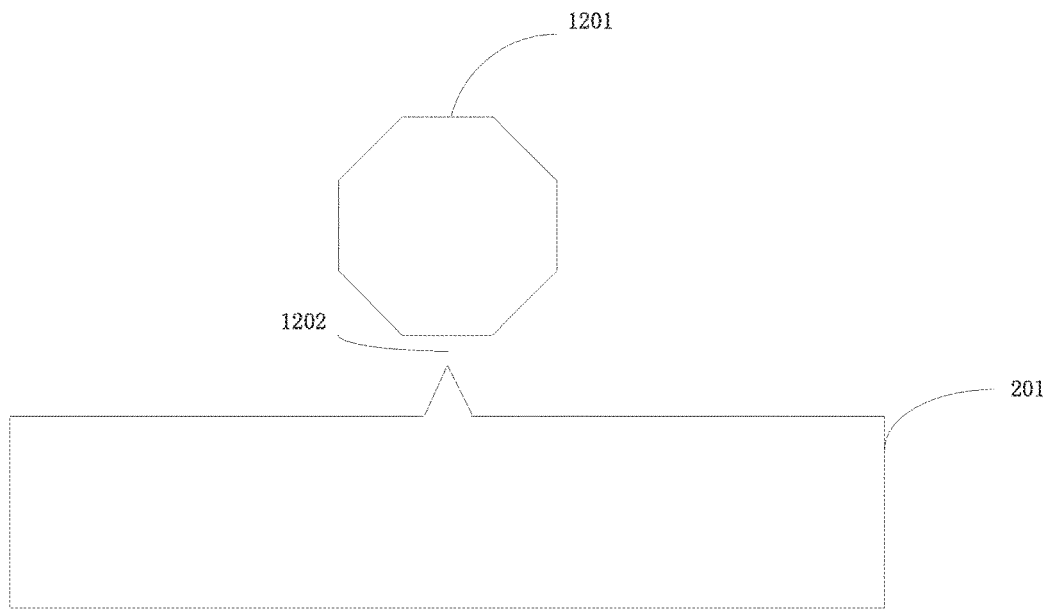

Thereafter, at 111, steps at 107 (oxidizing the SiGe nanowire to form an oxide layer) and 109 (removal of the oxide layer) are repeated to obtain a suspended Ge nanowire, as shown in FIGS. 12A and 12B. As the Si in the SiGe nanowire and the substrate material between the SiGe nanowire and the substrate are consumed, the SiGe nanowire becomes Ge nanowire 1201 and a tunnel (space, air gap) 1202 is formed between the Ge nanowire 1201 and substrate 201. In an exemplary embodiment, Ge nanowire 1201 may have a Ge content greater than 90% in atomic percent. It will be appreciated that the protruding portion of substrate 201 located below the Ge nanowire will be completely removed with the consumption of the substrate material. Furthermore, the number of repetitions of steps 107 and 109 can be determined based on the desired rounded shape of the Ge nanowire. For example, the shape of the Ge nanowire can be determined by slicing the Ge nanowire and the cross-sectional roundness of the Ge nanowire determines the number of repetitions of steps 107 and 109. In some embodiments, the formed Ge nanowire may have a diameter in the range between 5 nm and 10 nm, e.g., 6 nm, 8 nm. In some other embodiments, the formed Ge nanowire may have a length in the range between 10 nm and 100 nm, e.g., 30 nm, 50 nm, 80 nm.

Figure 13:
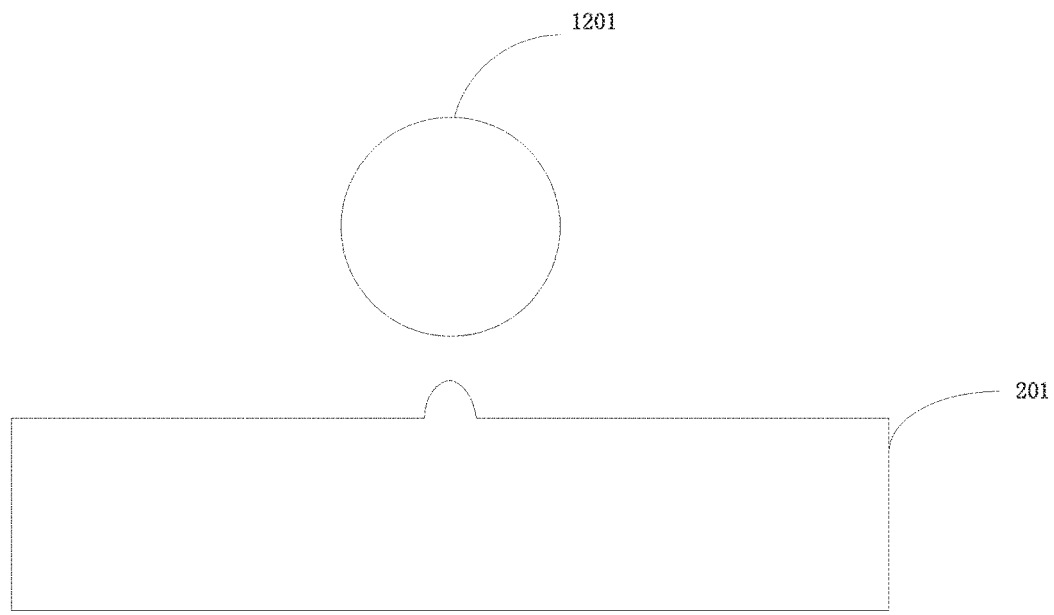
FIG. 13 is a cross-sectional view of the germanium nanowire after annealing according to an embodiment of the present invention.

As described above, the present invention provides a method for manufacturing a semiconductor device. The semiconductor device may include a Ge nanowire as a channel to increase carrier mobility and improve the device performance. The method may include annealing of the Ge nanowires. The Ge nanowire may be annealing in an inert gas (e.g., He) atmosphere or in a reducing gas atmosphere (e.g., $H_2$ or $D_2$) to have a cross-sectional area that is substantial circular or oval and cylindrical along its length, as shown in FIG. 13.

Figure 14A:
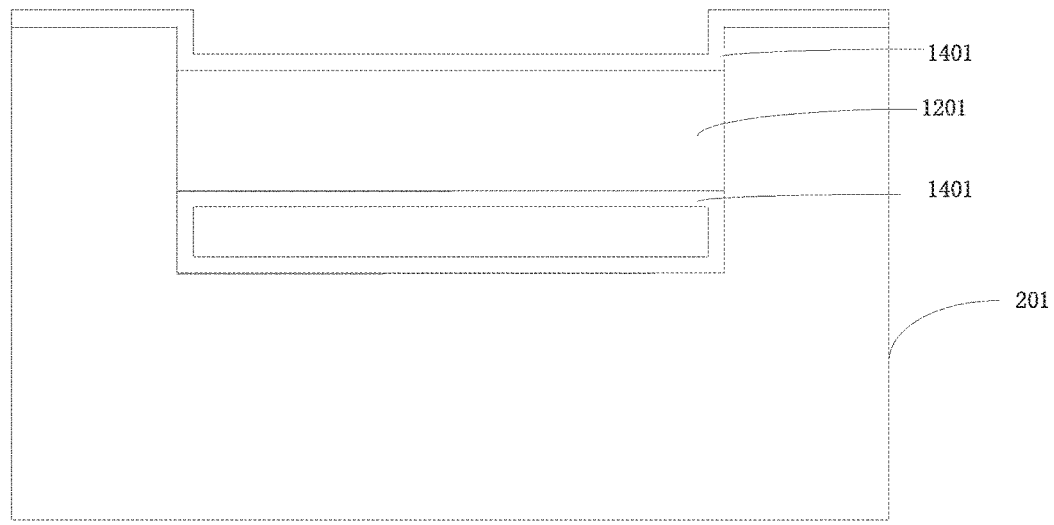
FIGS. 14A and 14B are longitudinal and transverse cross-sectional views of the germanium nanowire after deposition of a gate dielectric layer according to an embodiment of the present invention.
Figure 14B:
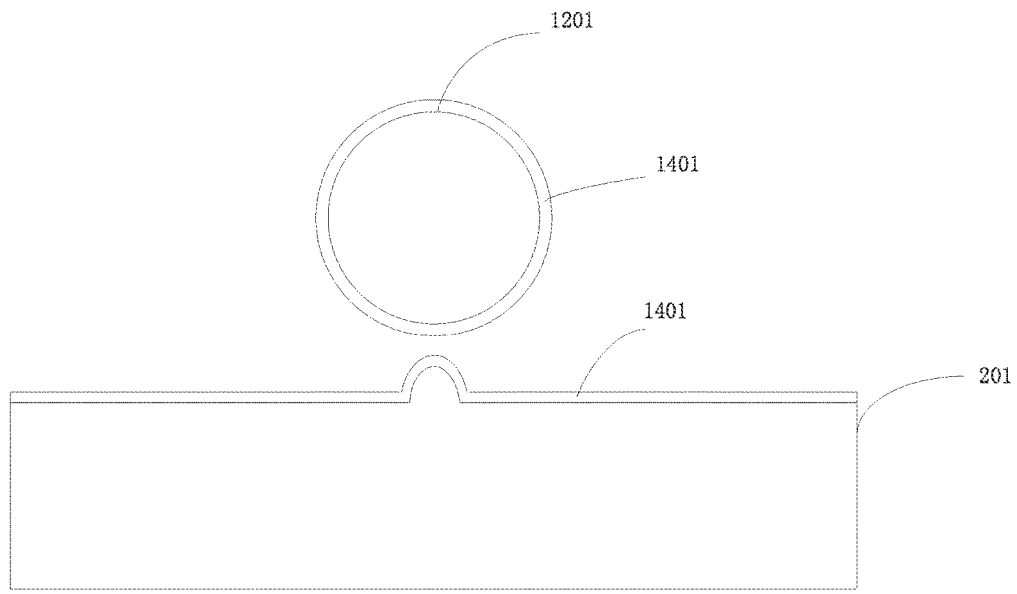
Figure 15A:
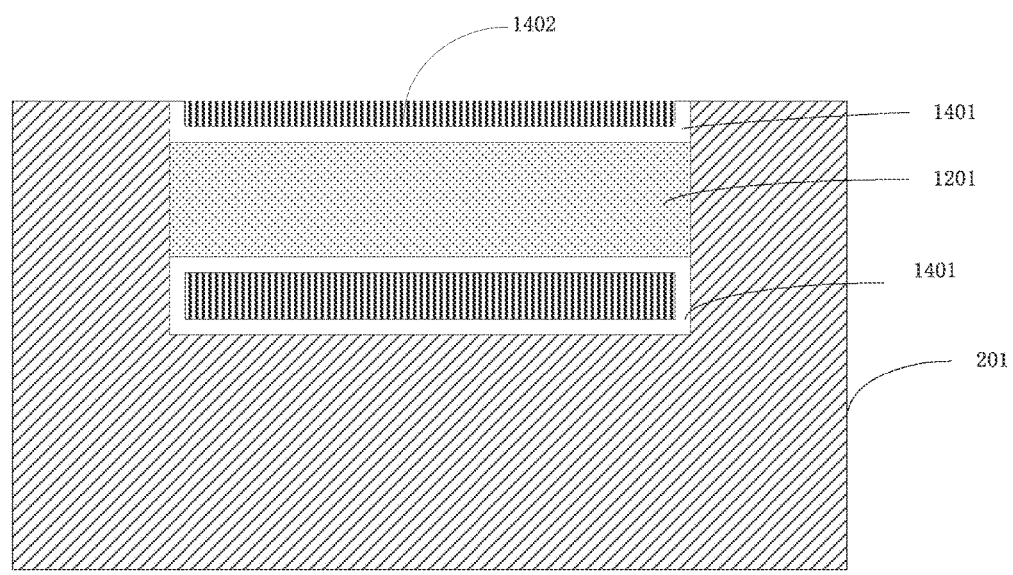
FIGS. 15A and 15B are longitudinal and transverse cross-sectional views of the germanium nanowire after formation of a gate electrode on the gate dielectric layer according to an embodiment of the present invention.
Figure 15B:
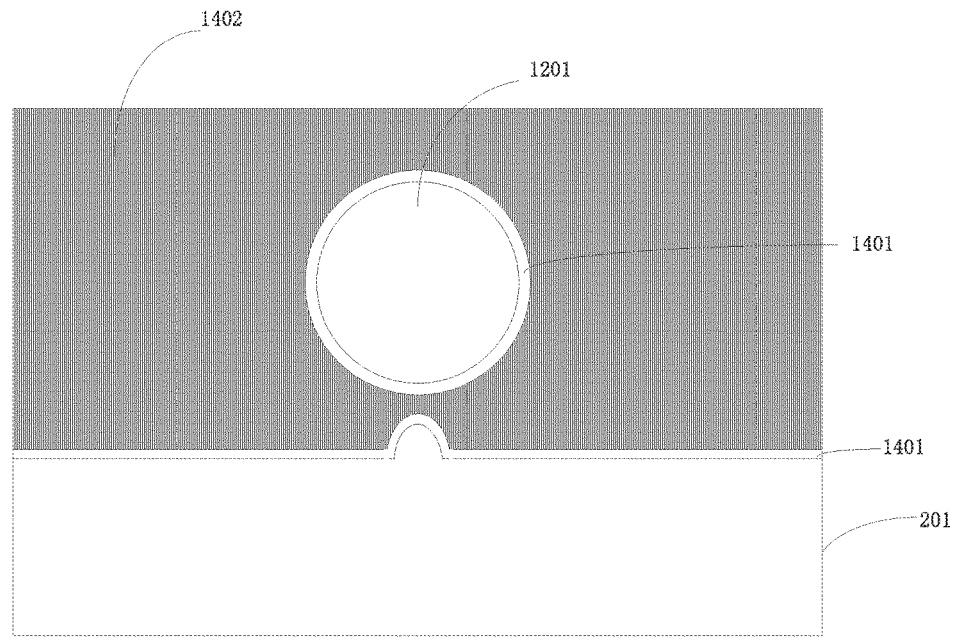

In an embodiment, the method may further include depositing a gate dielectric layer 1401 having, for example, a $GeO_2$ material or a high-k dielectric material, surrounding the Ge nanowire and on the bottom and sidewalls of the cavity, as shown in FIGS. 14A and 14B. In an embodiment, prior to depositing gate dielectric layer 1401, spacers may be formed on the sidewalls of the cavity. Then, a gate electrode 1402 is deposited on gate dielectric layer 1401 by physical vapor deposition (PVD). MOPVD, ALD, etc. so that gate electrode 1402 wraps around Ge nanowire 1201 for a gate-all-around channel. Gate electrode 1402 may comprise a metal material. In a specific embodiment, after formation of gate electrode 1402, a planarization process may be performed using a chemical mechanical polishing (CMP) process, so that the formed gate structure has the top surface of the gate electrode 1402 substantial flush (coplanar) with the top surface of substrate 201. Referring to FIGS. 15A and 15B, the gate structure includes gate dielectric layer 1401 surrounding Ge nanowire 1201 and disposed on the bottom and sidewalls of the cavity and gate electrode 1402, which wraps around Ge nanowire 1201 for a gate-all-around channel, in accordance with an embodiment of the present invention.

Figure 16:
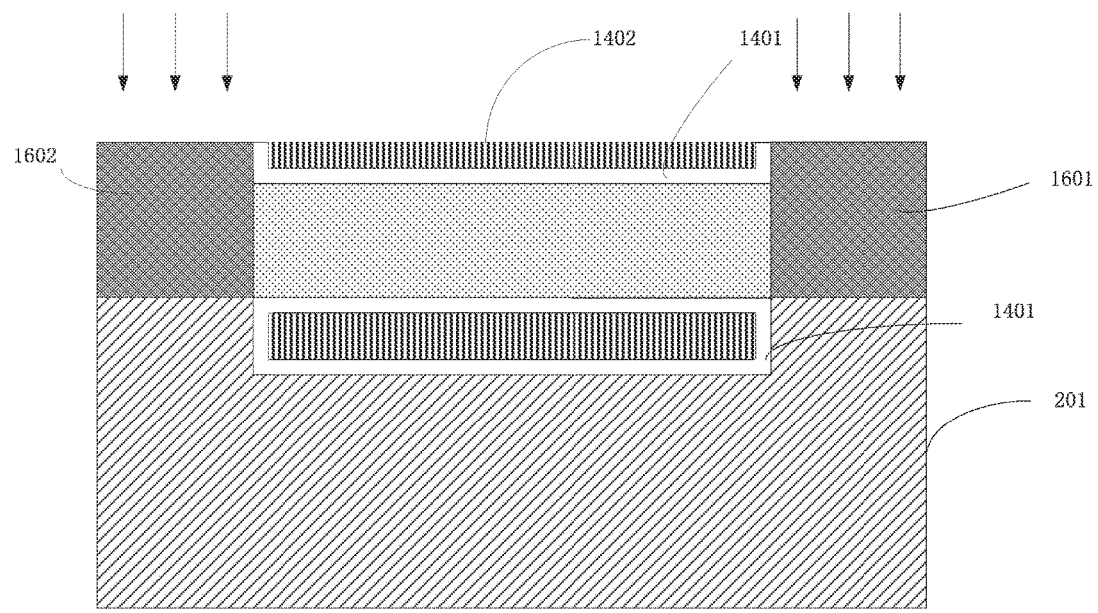
FIG. 16 is a cross-sectional view illustrating formation of source and drain regions according to an embodiment of the present invention.

In some embodiments, an ion implantation may be performed onto the substrate at opposite sides of the gate structure to form a source region 1601 and a drain region 1602, as shown in FIG. 16. In a preferred embodiment, p-type dopant such as boron (B) may be implanted onto the substrate. When the Ge nanowire comprises n-type dopants, a semiconductor device having an n-typed doped Ge nanowire is suitable for forming an inversion mode device, i.e., the channel is doped with a dopant type that is the opposite of the dopant type of the source and drain regions. When the Ge nanowire comprises p-type dopants, a semiconductor device having a p-typed doped Ge nanowire is suitable for forming a junction-less device, i.e., the channel is doped with the same type dopant as the source and drain regions.

Furthermore, the method may also include forming contacts on the source and drain regions to form source and drain electrodes.

Embodiments of the present invention provide a semiconductor device. The semiconductor device comprises a substrate, a cavity in the substrate, a germanium (Ge) nanowire suspending in the cavity. In an embodiment, the Ge nanowire has a substantially circular shape having a diameter in the range between 5 nm and 10 nm, e.g., 6 nm, 8 nm. In another embodiment, the Ge nanometer has a cylindrical length in the range between 10 nm and 100 nm, e.g., 30 nm, 50 nm, 80 nm.

In an embodiment, the semiconductor device may further include a gate structure having a gate dielectric layer disposed on the bottom surface and sidewall surfaces of the cavity and a gate electrode on the gate dielectric layer.

In an embodiment, the semiconductor device also includes source and drain regions disposed on opposite ends of the gate structure.

In an embodiment, the Ge nanowire includes an n-type dopant or a p-type dopant.

In an embodiment, when the Ge nanowire includes an n-type dopant, the semiconductor may be an inversion mode device. In another embodiment, when the nanowire includes a p-type dopant, the semiconductor may be a junction-less device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, comprising:
   providing a substrate;
   forming a patterned hard mask having an opening on the substrate;
   etching the substrate through the opening of the patterned hard mask to form a cavity in the substrate;
   removing the patterned hard mask;
   epitaxially growing a SiGe nanowire in the cavity;
   removing a portion of the substrate surrounding the SiGe nanowire to substantially expose a surface of the SiGe nanowire, the exposed surface of the SiGe nanowire including an exposed upper surface, exposed lateral surfaces, and an exposed portion of a bottom surface;
   oxidizing the exposed surface of the SiGe nanowire to form an oxide layer surrounding the exposed surface of the SiGe nanowire and on a surface of the substrate;
   removing the oxide layer by etching;
   repeating the oxidizing the exposed surface of the SiGe nanowire to gradually consume silicon in the SiGe nanowire and removing the oxide layer to form a suspended germanium (Ge) nanowire in the cavity.

2. The method of claim 1, further comprising:
   annealing the Ge nanowire at a temperature in a range between 800° C. and 1000° C.

3. The method of claim 2, wherein the annealing is performed in an inert gas atmosphere or in a reducing gas atmosphere.

4. The method of claim 2, further comprising:
   forming a gate structure having a gate dielectric layer disposed on a bottom surface and sidewall surfaces of the cavity and a gate electrode on the gate dielectric layer.

5. The method of claim 4, further comprising:
   forming source and drain regions on opposite sides of the gate structure.

6. The method of claim 1, wherein forming the patterned hard mask having an opening on the substrate comprises:
   forming a hard mask layer on the substrate;
   etching back the hard mask layer to form the opening.

7. The method of claim 1, wherein the SiGe nanowire has a Ge content in a range between 15% and 95% in atomic percent.

8. The method of claim 1, wherein the SiGe nanowire has a thickness in a range between 10 nm and 100 nm.

9. The method of claim 1, wherein oxidizing the exposed surface of the SiGe nanowire is carried out at a temperature in a range between 800 C and 1000 C.

10. The method of claim 1, wherein the Ge nanowire has a diameter in a range between 5 nm and 10 nm.

11. The method of claim 1, wherein the Ge nanowire has a length in a range between 10 nm and 100 nm.

12. The method of claim 1, wherein the SiGe nanowire comprises an n-type dopant or a p-type dopant.

13. The method of claim 12, wherein,
   if the SiGe nanowire comprises an n-type dopant, the semiconductor device is an inversion mode device; and
   if the SiGe nanowire comprises a p-type dopant, the semiconductor device is a junction-less device.

14. The method of claim 1, wherein the cavity has a hexagonal or sigma shape.

15. The method of claim 1, wherein the cavity has a bowl shape.

16. The method of claim 1, further comprising in-situ doping the epitaxially grown SiGe nanowire with an n-type dopant or a p-type dopant.

17. The method of claim 16, wherein the n-type dopant or the p-type dopant is gradually diffused into the Ge nanowire while the silicon is gradually consumed.

* * * * *